(12) United States Patent
Xu et al.

(10) Patent No.: US 10,964,772 B2
(45) Date of Patent: Mar. 30, 2021

(54) OLED PLATE, DISPLAY PANEL AND DISPLAY DEVICE USING THE SAME

(71) Applicant: BOE TECHNOLOGY GROUP CO., LTD., Beijing (CN)

(72) Inventors: Pan Xu, Beijing (CN); Yicheng Lin, Beijing (CN); Ling Wang, Beijing (CN); Cuili Gai, Beijing (CN); Guoying Wang, Beijing (CN); Yongqian Li, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/623,712

(22) PCT Filed: Jun. 4, 2019

(86) PCT No.: PCT/CN2019/089903
§ 371 (c)(1),
(2) Date: Dec. 17, 2019

(87) PCT Pub. No.: WO2019/233391
PCT Pub. Date: Dec. 12, 2019

(65) Prior Publication Data
US 2020/0176541 A1   Jun. 4, 2020

(30) Foreign Application Priority Data
Jun. 7, 2018   (CN) .......................... 201810579088.5

(51) Int. Cl.
*H01L 27/32* (2006.01)
*H01L 51/52* (2006.01)

(52) U.S. Cl.
CPC ...... *H01L 27/3276* (2013.01); *H01L 51/5218* (2013.01); *H01L 51/5228* (2013.01); *H01L 51/5234* (2013.01); *H01L 51/5253* (2013.01)

(58) Field of Classification Search
CPC ............. H01L 27/3276; H01L 51/5218; H01L 51/5228; H01L 51/5234; H01L 51/5253;
(Continued)

(56) References Cited

U.S. PATENT DOCUMENTS 7,265,391 B2 * 9/2007 Yamazaki ........... H01L 27/3276
257/88
8,581,281 B2   11/2013 Lee et al.
(Continued)

FOREIGN PATENT DOCUMENTS

CN   101847649 A   9/2010
CN   103907397 A   7/2014
(Continued)

OTHER PUBLICATIONS

Chinese Office Action dated Feb. 25, 2020, from application No. 201810579088.5.
(Continued)

*Primary Examiner* — Mohammad M Hoque
(74) *Attorney, Agent, or Firm* — Thomas|Horstemeyer, LLP (57) ABSTRACT

An OLED plate comprises: a substrate; a plurality of OLED devices, disposed on one side of the substrate and located in the display area; and an auxiliary cathode, disposed on the one side of the substrate and at least located in the peripheral area. Each of the OLED devices includes a reflective anode, an organic material functional layer and a transparent cathode disposed in a direction distal from the substrate in sequence. A portion of the auxiliary cathode located in the peripheral area is electrically connected to transparent cathodes of the plurality of OLED devices, and resistivity of the auxiliary cathode is less than resistivity of a transparent cathode of the plurality of OLED devices.

10 Claims, 7 Drawing Sheets

(58) Field of Classification Search
CPC ............. H01L 27/3246; H01L 27/3248; H01L 27/3279; H01L 27/3241–3297; H01L 51/50–56; H01L 51/0032–51/0095; H01L 27/3202–3204; H01L 27/3209; H01L 27/3225–3234
USPC .......................................................... 257/40
See application file for complete search history.

(56) References Cited

U.S. PATENT DOCUMENTS

| | | | |
|---|---|---|---|
| 10,056,036 B2 | 8/2018 | Hong | |
| 2008/0284323 A1 | 11/2008 | Kashiwabara et al. | |
| 2010/0244070 A1* | 9/2010 | Lee | H01L 51/5203 257/98 |
| 2011/0248297 A1* | 10/2011 | Ito | H01L 51/5203 257/93 |
| 2013/0026478 A1* | 1/2013 | Noda | H01L 27/3246 257/59 |
| 2014/0264315 A1* | 9/2014 | Ono | H01L 51/5228 257/40 |
| 2014/0312323 A1* | 10/2014 | Park | H01L 51/525 257/40 |
| 2016/0141545 A1* | 5/2016 | Kim | H01L 51/5253 257/40 |
| 2017/0330513 A1* | 11/2017 | Hong | H01L 27/3276 |
| 2018/0090554 A1* | 3/2018 | Choi | H01L 27/3258 |
| 2018/0151838 A1* | 5/2018 | Park | H01L 27/3258 |

FOREIGN PATENT DOCUMENTS

| | | |
|---|---|---|
| CN | 104681589 A | 6/2015 |
| CN | 104716156 A | 6/2015 |
| CN | 105974689 A | 9/2016 |
| CN | 107369698 A | 11/2017 |
| CN | 108511506 A | 9/2018 |
| CN | 105974689 B | 3/2019 |
| EP | 3 244 467 A1 | 11/2017 |

OTHER PUBLICATIONS

International Search Report and Written Opinion dated Aug. 8, 2019, from application No. PCT/CN2019/089903.
2nd Office Action dated Sep. 18, 2020 for Chinese Patent Application No. 201810579088.5.

* cited by examiner

OLED PLATE, DISPLAY PANEL AND DISPLAY DEVICE USING THE SAME

CROSS-REFERENCE TO RELATED APPLICATIONS

The present application is the 371 application of PCT Application No. PCT/CN2019/089903, filed on Jun. 4, 2019, which is based upon and claims the priority to the Chinese Patent Application No. 201810579088.5, entitled "OLED PLATE, DISPLAY PANEL AND DISPLAY DEVICE", filed on Jun. 7, 2018, the entire contents of both of which are hereby incorporated by reference.

TECHNICAL FIELD

The present disclosure relates to the field of display technologies, and in particular, to an OLED plate, a display panel and a display device using the same.

BACKGROUND

Organic light emitting diode (OLED) display panels have attracted more and more attention due to their advantages of thin thickness, light weight, active illumination, low cost, easy formation of flexible structures and wide viewing angle.

SUMMARY

In one aspect, an OLED plate is provided. The OLED plate has a display area and a peripheral area located at a periphery of the display area. The OLED plate includes a substrate, and a plurality of OLED devices, disposed on one side of the substrate and located in the display area. Each of the OLED devices includes a reflective anode, an organic material functional layer, and a transparent cathode disposed in a direction distal from the substrate in sequence. The OLED plate includes an auxiliary cathode disposed on the one side of the substrate, and at least located in the peripheral area. A portion of the auxiliary cathode located in the peripheral area is electrically connected to the transparent cathodes of the plurality of OLED devices, and resistivity of the auxiliary cathode is less than resistivity of the transparent cathodes of the plurality of OLED devices.

In some arrangements, a material of the auxiliary cathode is a metal material.

In some arrangements, the display area is a polygonal area. The portion of the auxiliary cathode located in the peripheral area includes sub-portions of the auxiliary cathode located outside each side of the polygonal area. Each of the sub-portions is electrically connected to the transparent cathodes of the plurality of OLED devices.

In some arrangements, the OLED plate further includes a cathode power source, electrically connected to at least one of the sub-portions of the auxiliary cathode.

In some arrangements, the auxiliary cathode includes a plurality of parallel first metal lines and a plurality of parallel second metal lines. The plurality of first metal lines and the plurality of second metal lines are arranged in an intersecting manner. Each of the first metal lines and each of the second metal lines both include portions located in the display area, and portions extending from the display area to the peripheral area.

In some arrangements, the display area includes a plurality of sub-pixel areas distributed in an array. Each of the sub-pixel area is provided with one of the OLED devices therein. One of the first metal lines is correspondingly arranged per N rows of the sub-pixel areas, and one of the second metal lines is correspondingly arranged per M columns of the sub-pixel areas. N and M are positive integers.

In some arrangements, the auxiliary cathode is disposed between the substrate and the plurality of OLED devices.

In some arrangements, the display area includes a plurality of sub-pixel areas distributed in an array. Each of the sub-pixel area is provided with one of the OLED devices therein. The OLED plate further includes a driving circuit, disposed in each of the sub-pixel area, and being electrically connected to the reflective anode of the corresponding OLED device in the sub-pixel area.

In some arrangements, the auxiliary cathode is disposed between the plurality of OLED devices and the corresponding driving circuit. The OLED plate further includes a passivation layer and a first organic layer, sequentially disposed on one side of the driving circuit close to the auxiliary cathode. The auxiliary cathode is disposed on a surface of the first organic layer distal from the passivation layer.

In some arrangements, the OLED plate further includes a second organic layer, disposed on one side of the auxiliary cathode distal from the first organic layer. The plurality of OLED devices are disposed on a surface of the second organic layer distal from the auxiliary cathode.

In some arrangements, the OLED plate further includes a plurality of gate lines. Each of the gate lines is electrically connected to a plurality of the driving circuits in at least one row of the sub-pixel areas; and a plurality of data lines. Each data line is electrically connected to the plurality of driving circuits in at least one column of the sub-pixel areas. Each of the first metal line is parallel to the plurality of gate lines. Each of the second metal line is parallel to the plurality of data lines.

In some arrangements, the OLED plate further includes an encapsulation layer, disposed on one side of the transparent cathodes of the plurality of OLED devices distal from the substrate.

In another aspect, a display panel is provided. The display panel includes the OLED plate described in any of the above arrangements.

In still another aspect, a display device is provided. The display device includes the display panel of any of the above arrangements.

BRIEF DESCRIPTION OF THE DRAWINGS

In order to more clearly illustrate the technical solutions in some arrangements of the present disclosure, the drawings used in the description of some arrangements will be briefly described below. It is apparent that the drawings in the following description show only some of the arrangements of the present disclosure, and according to the drawings described herein, other drawings may be obtained by those skilled in the art without paying out creative work.

DETAILED DESCRIPTION

The technical solutions in some arrangements of the present disclosure are clearly and completely described below with reference to the accompanying drawings in the arrangements of the present disclosure. It is apparent that the described arrangements are only a part of the arrangements of the present disclosure, not all arrangements. All other arrangements that can be obtained by those of ordinary skill in the art based on some arrangements of the present disclosure are within the scope of the disclosure.

With the development of OLED display technology, users have higher and higher requirements on the performances of the OLED display panels. For example, OLED display panels are required to have high resolution (referred to as pixels per inch, PPI for short, as well). Therefore, the respective OLED devices in the OLED display panel adopt a top-emission type structure, that is, a cathode of the respective OLED devices adopts a transparent cathode, which can effectively realize a high PPI.

However, for a middle size OLED display panel, in a case where each of the OLED devices adopts a transparent cathode, since the resistivity of the respective transparent cathodes is large, it is easy to make the transparent cathodes of the respective OLED devices in different areas of the OLED display panel have different degrees of voltage variations, such as voltage drop (IR Drop), or voltage rise (IR Rise), thus causing the display brightness of the OLED display panel hard to be uniform.

Figure 1:
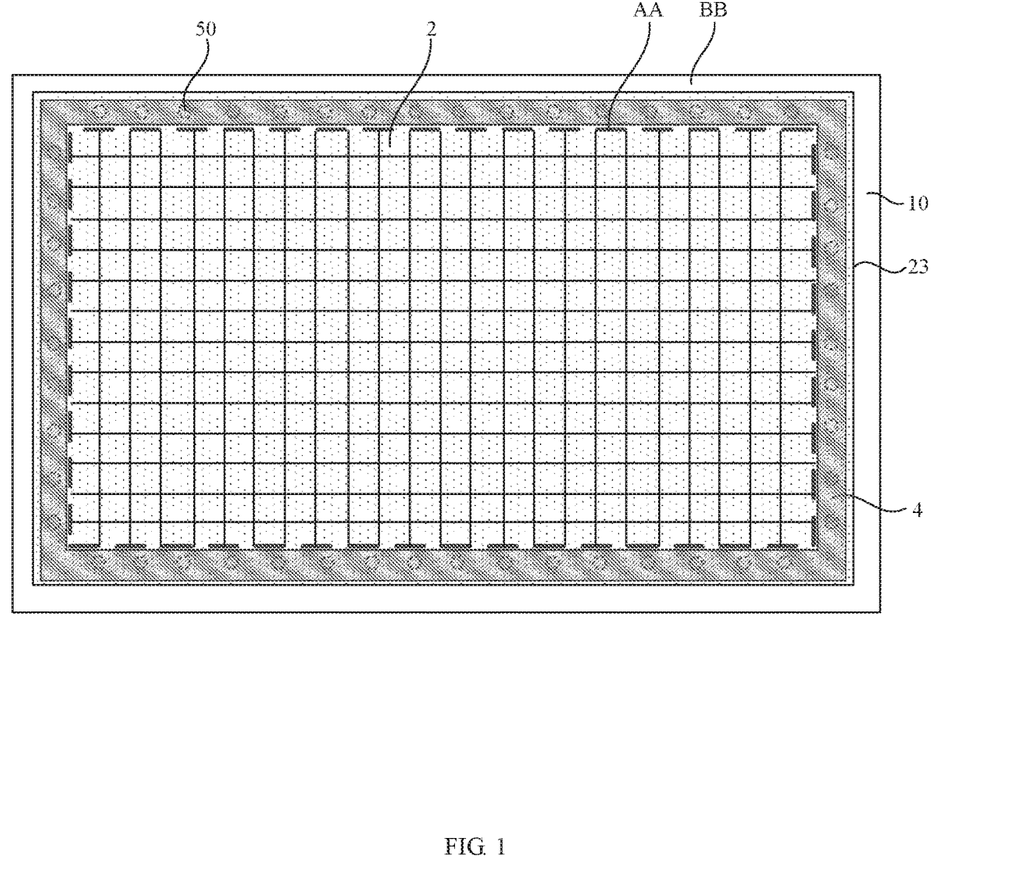
FIG. 1 is a schematic diagram of an OLED plate in accordance with some arrangements of the present disclosure.
Figure 5:
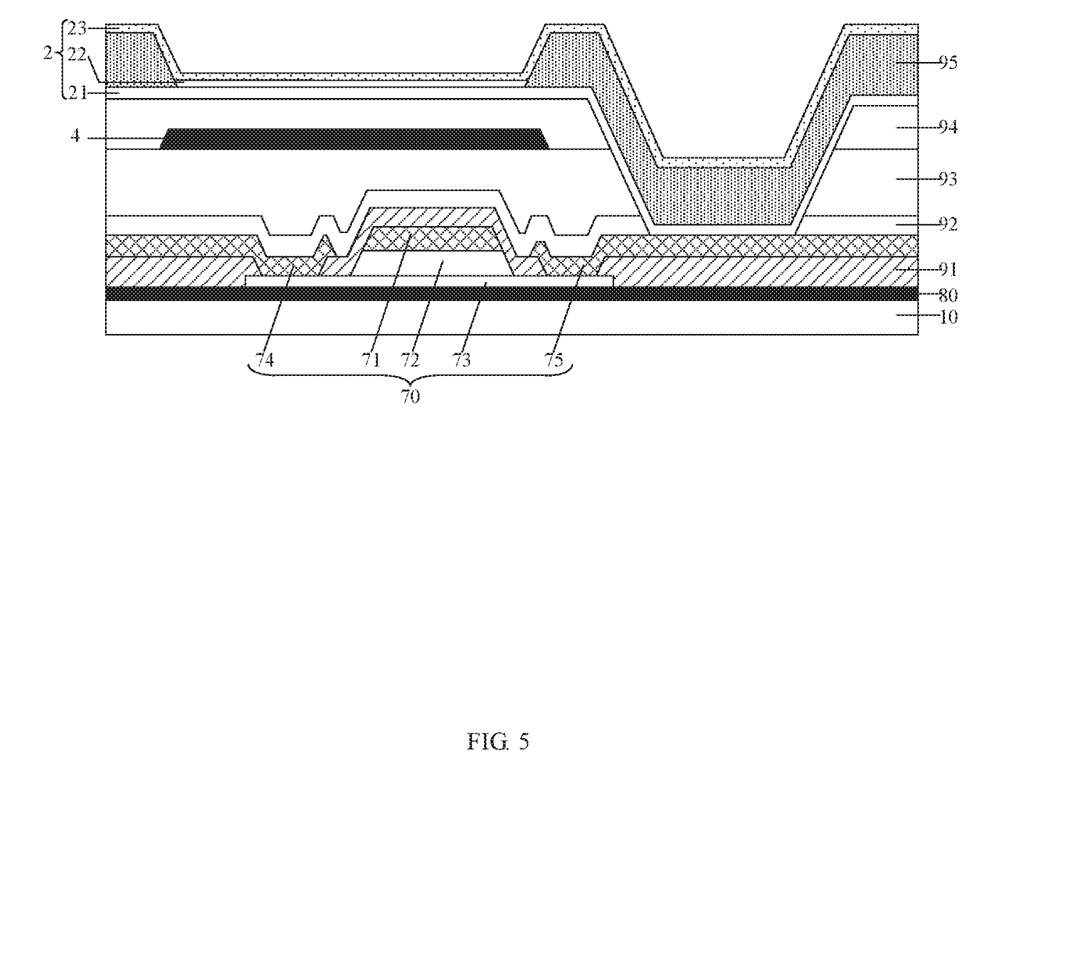
FIG. 5 is a partial cross-sectional view of an OLED plate in accordance with some arrangements of the present disclosure.

Some arrangements of the present disclosure provide an OLED plate. As shown in FIGS. 1 and 5, the OLED plate has a display area AA and a peripheral area BB located at the periphery of the display area AA. The OLED plate includes a substrate 10, a plurality of OLED devices 2 disposed on one side of the substrate 10 and located in the display area AA, and an auxiliary cathode 4 disposed on the one side of the substrate 10 and at least located in the peripheral area BB. Each of the OLED devices 2 includes a reflective anode 21, an organic material functional layer 22, and a transparent cathode 23 disposed in a direction distal from the substrate in sequence, as shown in FIG. 5. A portion of the auxiliary cathode 4 located in the peripheral area BB is electrically connected to the transparent cathodes 23 of the plurality of OLED devices 2, and resistivity of the auxiliary cathode 23 is less than resistivity of the transparent cathodes 23 of the plurality of OLED devices 2.

In the OLED display plate, the display area AA includes a plurality of sub-pixel areas distributed in an array, and each of the sub-pixel area is provided with one OLED device 2 therein. Only the transparent cathodes 23 in the OLED device are illustrated in FIG. 1, and not all structures of the OLED device are illustrated. Furthermore, the reflective anodes 21 of the respective OLED devices 2 located in different sub-pixel areas are insulated from each other. The organic material functional layer 22 of each OLED device 2 includes at least one light-emitting layer, that is, the organic material functional layer 22 of each OLED device 2 can emit light under the control of the corresponding reflective anode 21 and the transparent cathode 23. For example, the organic material functional layer 22 includes a hole transport layer, a light emitting layer, and an electron transport layer disposed in a stacked manner sequentially; or, the organic material functional layer 22 includes a hole injection layer, a hole transport layer, a light emitting layer, an electron transport layer and an electron injection layer disposed in a stacked manner sequentially.

In a case where each OLED device 2 in the OLED display plate adopts a top-emission type structure, the transparent cathodes of the respective OLED devices 2 are shared, that is, the transparent cathodes of the respective OLED devices 2 are connected to each other in a one-layer structure. Furthermore, the transparent cathodes of the respective OLED devices 2 extend from the display area AA to the peripheral area BB for facilitating to realize an electrical connection of a portion of the auxiliary cathode 4 located in the peripheral area BB with the transparent cathodes 23 of the plurality of OLED devices 2.

In some examples, the material of the transparent cathode 23 of each OLED device 2 is selected from transparent conductive materials such as indium tin oxide (ITO) or indium zinc oxide (IZO). The auxiliary cathode 4 is formed by using a material having resistivity lower than that of the transparent cathodes 21. For example, the material of the auxiliary cathode 4 is metal material. Illustratively, the material of the auxiliary cathode 4 is selected from one of aluminum (Al), molybdenum (Mo), copper (Cu), silver (Ag), chromium (Cr), gold (Au), or a combination thereof.

In the OLED plate, the shape of the display area AA can be set according to actual needs. In some examples, referring to FIG. 2, the display area AA is a polygon, and the portion of the aforementioned auxiliary cathode 4 located in the peripheral area BB includes sub-portions (41, 42, 43 and 44) of the auxiliary cathode 4 located outside each side of the display area AA (the polygonal area). The OLED plate further includes a cathode power source 60 electrically connected to at least one of the sub-portions of the auxiliary cathode 4. Providing one cathode power source 60 in the OLED plate facilitates one-side supply of the cathode power source 60, thus facilitating fabrication of a narrow bezel and a low-cost OLED display panel.

Figure 2:
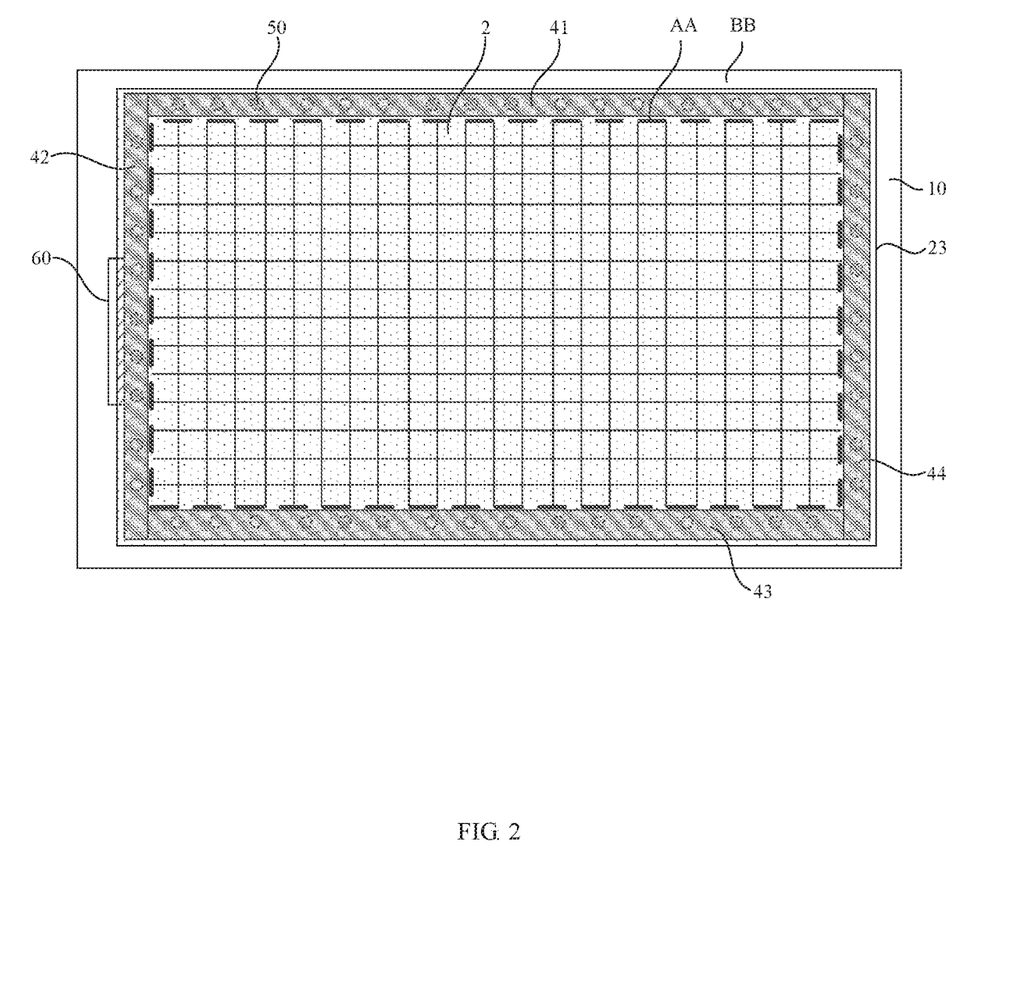
FIG. 2 is a schematic diagram of an OLED plate in accordance with some arrangements of the present disclosure.

Illustratively, the display area AA is a rectangle, and the portion of the auxiliary cathode 4 located in the peripheral area BB includes: a first sub-portion 41, a second sub-portion 42, a third sub-portion 43 and a fourth sub-portion 44 shown in FIG. 2. The second sub-portion 42 is electrically connected to the cathode power source 60, and the cathode power source 60 provides power on one side.

Figure 3:
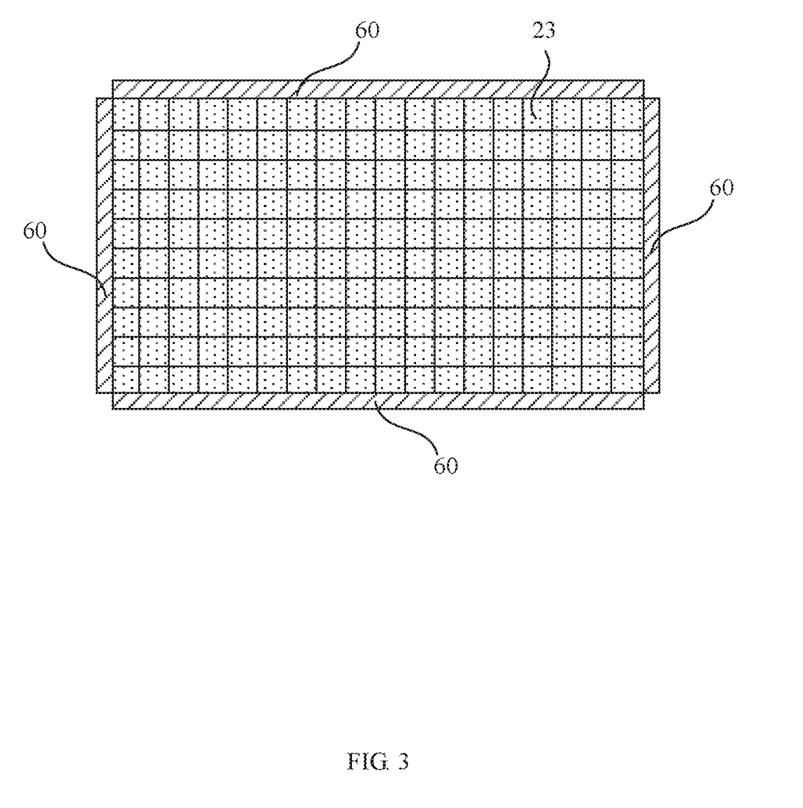
FIG. 3 is an equivalent schematic diagram of an auxiliary cathode supplying power to transparent cathodes in the OLED plate shown in FIG. 2.

The resistivity of the auxiliary cathode 4 is less than the resistivity of the transparent cathodes 23, that is, the impedance of the auxiliary cathode 4 is small or very small, such that, in the case where the cathode power source 60 provides power on one side, via the sub-portions of the auxiliary cathode 4 located in the peripheral area BB, the voltage supplied by the cathode power supply 60 is respectively input to the plurality of transparent cathodes 23 in the vicinity of the peripheral area BB, which is equivalent that a cathode power source 60 is disposed outside of each side of the display area AA, and supplies a voltage to the corresponding plurality of transparent cathodes 23, as shown in FIG. 3. As such, the plurality of transparent cathodes 23 (the portions extending to the peripheral area BB) directly electrically connected to the sub-portions of the auxiliary cathode 4 located in the peripheral area BB have substantially the same potential, thus facilitating to reduce the voltage variation difference of the transparent cathodes 23 of respective OLED devices 2 located in different areas in the OLED display panel to ensure uniform display brightness of the OLED display panel.

It can be understood that, in this case, the transparent cathodes 23 located at the central position of the display area AA in the OLED plate still have the largest voltage variation due to the impedance of each transparent cathode 23. However, compared with the OLED plate without the auxiliary cathode 44 but with the cathode power source 60 supplying power on one side, the maximum voltage variation that can occur on each transparent cathode 23 in the OLED plate provided by some arrangements of the present disclosure can be greatly reduced to be within an acceptable range. Therefore, when the OLED plate according to some arrangements of the present disclosure is applied to a non-oversized display panel, especially a middle size display panel, even if there are still voltage variations on several transparent cathodes 23, the uniformity of the display brightness of the display panel is less affected.

Figure 4:
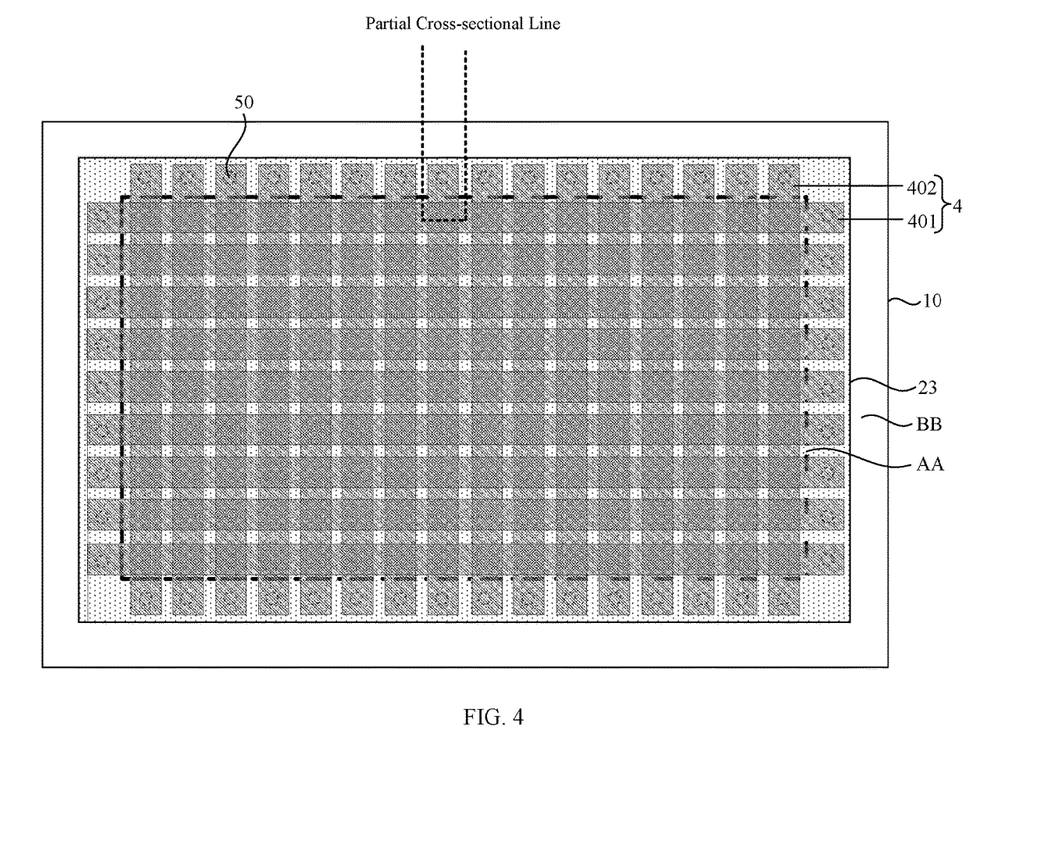
FIG. 4 is a schematic diagram of an OLED plate in accordance with some arrangements of the present disclosure.

In some arrangements, as shown in FIG. 4, the auxiliary cathode 4 include a plurality of parallel first metal lines 401 and a plurality of parallel second metal lines 402, and the plurality of first metal lines 401 and the plurality of second metal lines 402 are arranged in an intersecting manner. Each of the first metal lines 401 and each of the second metal lines 402 both include portions located in the display area AA, and portions extending from the display area AA to the peripheral area BB; that is, each of the first metal lines 401 and each of the second metal lines 402 extend from the display area AA to the peripheral area BB, and the auxiliary cathode 4 is disposed in a mesh shape. Further, each of the first metal lines 401 and each of the second metal lines 402 are connected to each other.

Some arrangements of the present disclosure make the auxiliary cathode 4 into a mesh shape, and the impedance of the auxiliary cathode 4 can be further reduced by controlling the line width of each of the first metal lines 401 and each of the second metal lines 402. Moreover, since the auxiliary cathode 4 adopts a mesh shape, the manufacturing process is simple and the technical difficulty is small.

Based on the above, in some arrangements, one first metal line 401 is correspondingly arranged per N rows of the sub-pixel areas; one second metal line 402 is correspondingly arranged per M columns of the sub-pixel areas. N and M are positive integers. That is to say, all the rows of the sub-pixel areas in the display area AA are divided into a plurality of groups, each group includes N rows of sub-pixel areas, and then a first metal line 401 is disposed in an area corresponding to each group. Similarly, all columns of the sub-pixel areas in the display area AA are divided into a plurality of groups, each group includes M columns of sub-pixel areas, and then a second metal line 402 is disposed in an area corresponding to each group. By way of example, N and M are equal. For example, N and M are both 1.

In addition, the line width of each of the first metal lines 401 and each of the second metal lines 402 may be set as wide as possible within a permitted range to ensure that each of the first metal lines 401 and each of the second metal lines 402 both have impedance as little as possible.

Figure 6:
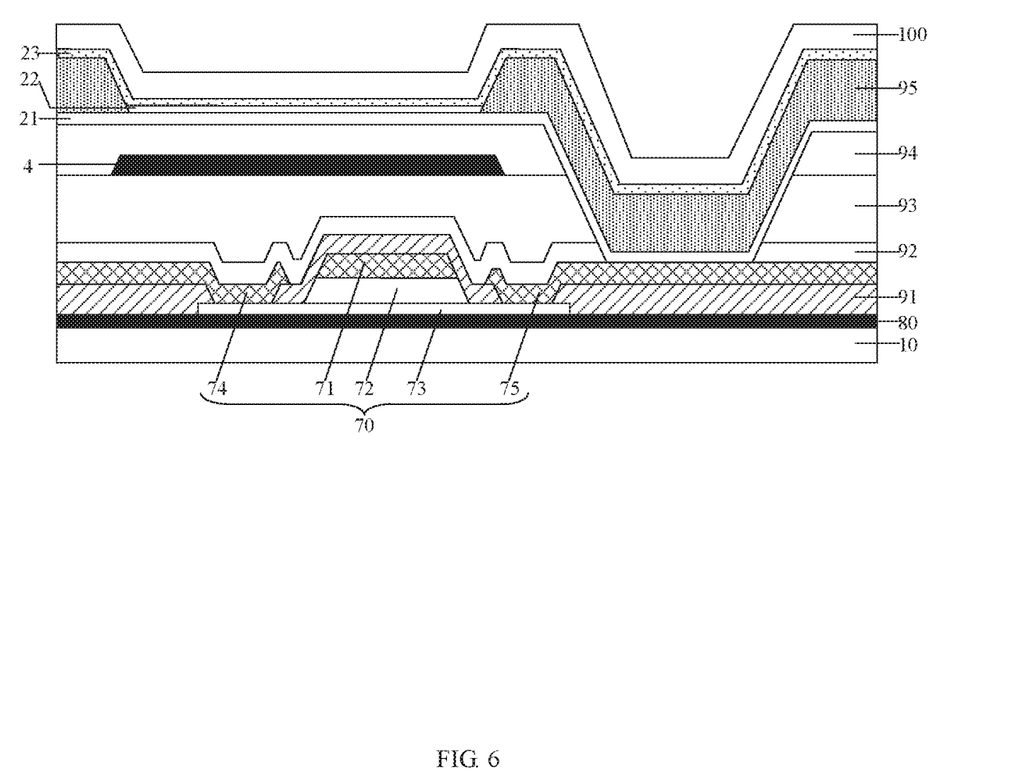
FIG. 6 is a partial cross-sectional view of an OLED plate in accordance with some arrangements of the present disclosure.

In some arrangements, referring to FIGS. 5 and 6, the auxiliary cathode 4 is disposed between the substrate 10 and the aforementioned plurality of OLED devices 2. Since each OLED device 2 is a top-emission type OLED device, the auxiliary cathode 4 is located between the substrate 10 and each OLED device 2, which can ensure that the auxiliary cathode 4 does not adversely affect the aperture ratio of the OLED plate, thus, the line width of each of the first metal lines 401 and each of the second metal lines 402 is set as needed to ensure the impedance of the auxiliary cathode 4 is lowered.

Further, in the process of fabricating the auxiliary cathode 4, the auxiliary cathode 4 is formed on one side of the substrate 10, and then the respective OLED devices 2 are formed on one side of the auxiliary cathode 4 distal from the substrate 10, which can ensure that the manufacturing process of the auxiliary cathode 4 and the fabrication process of the OLED device are separate to each other, and are not restricted to each other.

In some arrangements, referring to FIG. 5 and FIG. 6, the OLED plate further includes a driving circuit disposed on the substrate 10 and located in each sub-pixel area. The driving circuit is electrically connected to the reflective anode 21 of the OLED device 2 in the corresponding sub-pixel area. FIGS. 5 and 6 are partial cross-sectional views of an OLED plate in accordance with some arrangements of the present disclosure, where the partial cross-sectional line is shown by a U shape dotted line in FIG. 4. Here, it is shown that one second metal line 402 passes one column of pixels.

It is to be noted that the OLED plate further includes a plurality of gate lines and a plurality of data lines (not shown). Each of the gate lines is electrically connected to a plurality of driving circuits in at least one row of sub-pixel areas, each data line is electrically connected to the plurality of driving circuits in at least one column of sub-pixel areas. Each of the driving circuits is configured to drive the corresponding OLED device 2 to emit light under the control of signals provided by the corresponding gate lines and data lines.

In addition, each of the first metal lines 401 in the auxiliary cathode 4 is disposed in parallel with the plurality of gate lines, and each of the second metal lines 402 in the auxiliary cathode 4 is disposed in parallel with the plurality of data lines, which is advantageous for simplifying the wiring design of the auxiliary cathode 4, so as to facilitate the fabrication of the auxiliary cathode 4.

In some examples, referring to FIGS. 5 and 6, each of the driving circuits includes a driving transistor 70, each of which includes a gate 71, a gate insulating layer 72, an active layer 73, a source electrode 74, and a drain electrode 75. The drain electrode 75 of the driving transistor 70 is electrically connected to the reflective anode 21 of the corresponding OLED device 2. For example, as shown in FIG. 5, each of the driving transistors 70 includes the active layer 73, the gate insulating layer 72, the gate electrode 71, an interlayer insulating layer 91, the source electrode 74 and the drain electrode 75 sequentially patternized be arranged on the substrate 10. The source electrode 74 and the drain electrode 75 are disposed on the same layer, and the source electrode 74 and the drain electrode 75 are electrically connected to the active layer 73 through corresponding via holes disposed on the interlayer insulating layer 91, respectively. Based on the above, if the material of the active layer 73 is oxide semiconductor, a light shielding layer 80 is further disposed between the active layer 73 and the substrate 10 to prevent external optical signals from affecting the performance of the active layer 73.

It should be noted that, in FIG. 5, the driving transistor 70 with a top-gate structure is taken as an example, but some arrangements of the present disclosure are not limited thereto, and the structure type of each driving transistor 70 may be selected according to actual needs. Further, each of the driving circuits is not limited to including a driving transistor 70. For example, each driving circuit further includes at least one thin film transistor or at least one storage capacitor or the like connected to the driving transistor 70. Some arrangements of the present disclosure do not limit the structure of the driving circuit, as long as the driving circuit has a function of driving the corresponding OLED device to emit light.

In some examples, the plurality of gate lines are disposed in the same layer as the gate 71 of the driving transistor 70, and the plurality of data lines are disposed in the same layer as the source electrode 74 and the drain electrode 75 of the driving transistor 70. Here, disposing in the same layer means that they are made of the same material and formed in one patterning process. The patterning process includes a photolithography process, or a process including a photolithography process and an etching process. The photolithography process refers to a process including forming a film (for example, chemical vapor deposition, CVD), exposure, development, and the like, and forming a pattern using a photoresist, a mask, an exposure machine, or the like.

In some arrangements, as shown in FIG. 5, the auxiliary cathode 4 is disposed between the plurality of OLED devices 2 and corresponding driving circuits (e.g., the drive transistor 70). The OLED plate further includes a passivation layer 92 and a first organic layer 93 sequentially disposed on one side of the driving circuit close to the auxiliary cathode 4. The auxiliary cathode 4 is disposed on a surface of the first organic layer 92 distal from the passivation layer 93. The auxiliary cathode 4 is disposed between the plurality of OLED devices 2 and the corresponding driving circuits (for example, the driving transistor 70). The manufacturing process of the corresponding OLED plate is: first, the respective driving circuits are formed, and then the auxiliary cathode 4 is formed, and then the reflective anode 21, the organic material functional layer 22, and the transparent cathode 23 of the corresponding OLED device 2 are sequentially formed.

In some arrangements of the present disclosure, the passivation layer 92 and the first organic layer 93 are disposed between the auxiliary cathode 4 and the respective driving circuits, which can increase the distance between the auxiliary cathode 4 and the respective driving circuits, thus reducing the coupling capacitance between the auxiliary cathode 4 and the electrode or wire below it (on the side close to the substrate 10). Further, the passivation layer 92 is provided on one side of each of the driving circuits close to the auxiliary cathode 4, such that circuit elements such as the driving transistor 70 in the driving circuit can be protected by the passivation layer 92, so as to prevent water and oxygen from entering.

In some arrangements, referring to FIG. 5, the OLED plate further includes a second organic layer 94 disposed on one side of the auxiliary cathode 4 distal from the first organic layer 93. The plurality of OLED devices are disposed on a surface of the second organic layer 94 distal from the auxiliary cathode 4. The second organic layer 94 can play the role of flattening to ensure that each OLED device 2 is fabricated on a flat surface.

In addition, referring to FIG. 5, each sub-pixel area of the OLED plate is generally defined by a pixel defining layer 95, that is, the organic material functional layer 22 of each OLED device 2 in the OLED plate is generally formed in an opening area corresponding to the pixel defining layer 95.

Since at least the second organic layer 94 and the pixel defining layer 95 are disposed between the auxiliary cathode 4 and the transparent cathode 23 of each OLED device 2. Referring to FIG. 1 and FIG. 2, the portion of the auxiliary cathode 4 located in the peripheral area BB is electrically connected to the transparent cathodes 23 of the plurality of OLED devices 2 in a manner that: the portion of the auxiliary cathode 4 located in the peripheral area BB passes through a plurality of vias 50 disposed in both the second organic layer 94 and the pixel defining layer 95, then is electrically connected to the portions of the transparent cathodes 23 of the plurality of OLED devices 2 extending into the peripheral area BB. In some examples, as shown in FIG. 1, the plurality of vias 50 through which the auxiliary cathode 4 passes are uniformly distributed in the peripheral area BB.

In some arrangements, as shown in FIG. 6, the OLED plate further includes an encapsulation layer 100 disposed on one side of the transparent cathodes 23 of the plurality of OLED devices 2 distal from the substrate 10. For example, the encapsulation layer 100 is formed using the same material as the passivation layer 92, for example, by a chemical vapor deposition (CVD) process. In some arrangements of the present disclosure, the encapsulation layer 100 is disposed on the one side of the transparent cathodes 23 of the plurality of OLED devices 2 distal from the substrate 10, such that the OLED device 2 can be packaged and protected by using the encapsulation layer 100 to effectively improve the service life of each OLED device 2.

Some arrangements of the present disclosure provide a display panel. The display panel includes the OLED plate described in some of the above arrangements. The display panel can be applied to a product or component having a display function, such as a display, a television, a digital photo frame, a mobile phone, or a tablet, or the like. The display panel has the same beneficial effects as the OLED plate, and details are not repeated herein again.

Figure 7:
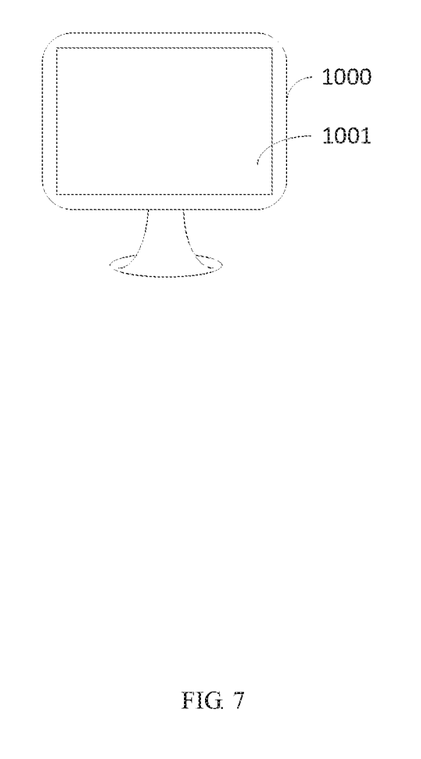
FIG. 7 is a schematic diagram of a display device in accordance with some arrangements of the present disclosure.

Some arrangements of the present disclosure also provide a display device. Referring to FIG. 7, the display device 1000 includes the display panel 1001 described in the above arrangement. The display device has the same advantageous effects as the above display panel, and details are not repeated herein again. Optionally, the display device includes: a product or a component having a display function, such as an electronic paper, a mobile phone, a tablet computer, a television, a display, a notebook computer, a digital photo frame, a navigator, and the like.

In the description of the above arrangements, specific features, structures, materials or characteristics may be combined in any suitable manner in any one or more arrangements or examples.

The above is only the specific arrangement of the present disclosure, but the scope of the present disclosure is not limited thereto, and any person skilled in the art can easily think of variations or substitutions within the technical scope of the disclosure. It should be covered within the scope of protection of the present disclosure. Therefore, the scope of protection of the present disclosure should be determined by the scope of the claims.

What is claimed is:

1. An organic light-emitting diode (OLED) plate, comprising:
   a display area and a peripheral area located at a periphery of the display area;
   a substrate;
   a plurality of OLED devices disposed on one side of the substrate and located in the display area, wherein each of the plurality of OLED devices comprises a reflective anode, an organic material functional layer, and a transparent cathode disposed in a direction distal from the substrate in sequence; and an auxiliary cathode disposed on the one side of the substrate and a portion of the auxiliary cathode being located in the peripheral area, wherein:

the portion of the auxiliary cathode located in the peripheral area is electrically connected to the transparent cathode of each of the plurality of OLED devices, and a resistivity of the auxiliary cathode is less than a resistivity of the transparent cathode of each of the plurality of OLED devices;

the auxiliary cathode comprises a plurality of parallel first metal lines and a plurality of parallel second metal lines arranged in an intersecting manner, and each of the plurality of parallel first metal lines and each of the plurality of parallel second metal lines both have portions thereof being located in the display area, and portions thereof extending from the display area to the peripheral area;

the display area comprises a plurality of sub-pixel areas distributed in an array, and each of the plurality of sub-pixel areas is provided with one of the OLED devices therein;

the OLED plate further comprises a driving circuit disposed in each of the plurality of sub-pixel areas, and being electrically connected to the reflective anode of the corresponding OLED device in the sub-pixel area;

the auxiliary cathode is disposed between the plurality of OLED devices and the corresponding driving circuit;

the OLED plate further comprises a passivation layer and a first organic layer sequentially disposed on one side of the driving circuit close to the auxiliary cathode, and the auxiliary cathode is disposed on a surface of the first organic layer distal from the passivation layer;

the passivation layer and the first organic layer are disposed between the auxiliary cathode and the driving circuit to increase a distance between the auxiliary cathode and the driving circuit and to reduce a coupling capacitance between the auxiliary cathode and other electrode or wire below the auxiliary cathode;

the display area further comprises a pixel defining layer;

each of the plurality of sub-pixel areas of the OLED plate is defined by the pixel defining layer;

the organic material functional layer of each of the plurality of OLED devices in the OLED plate is formed in an opening area corresponding to the pixel defining layer; and the auxiliary cathode is disposed directly under the organic material functional layer of the corresponding OLED device and within the opening area.

2. The OLED plate according to claim 1, wherein:
the display area is a polygonal area;
the portion of the auxiliary cathode located in the peripheral area comprises sub-portions of the auxiliary cathode located outside each side of the polygonal area; and
each of the sub-portions is electrically connected to the corresponding transparent cathode of each of the plurality of OLED devices.

3. The OLED plate according to claim 2, further comprising a cathode power source electrically connected to at least one of the sub-portions of the auxiliary cathode.

4. The OLED plate according to claim 1, wherein one of the plurality of parallel first metal lines is correspondingly arranged per N rows of the plurality of sub-pixel areas, and one of the plurality of parallel second metal lines is correspondingly arranged per M columns of the plurality of sub-pixel areas, wherein N and M are positive integers.

5. The OLED plate according to claim 1, wherein the auxiliary cathode is disposed between the substrate and the plurality of OLED devices.

6. The OLED plate of claim 1, further comprising:
a second organic layer, disposed on one side of the auxiliary cathode distal from the first organic layer, wherein the plurality of OLED devices are disposed on a surface of the second organic layer distal from the auxiliary cathode.

7. The OLED plate according to claim 1, further comprising:
a plurality of gate lines, wherein each of the plurality of gate lines is electrically connected to a plurality of the driving circuits in at least one row of the plurality of sub-pixel areas; and
a plurality of data lines, wherein each of the plurality of data lines is electrically connected to the plurality of driving circuits in at least one column of the plurality of sub-pixel areas,
wherein each of the plurality of parallel first metal lines is parallel to the plurality of gate lines, and each of the plurality of parallel second metal lines is parallel to the plurality of data lines.

8. The OLED plate according to claim 1, further comprising an encapsulation layer disposed on one side of the transparent cathode of each of the plurality of OLED devices distal from the substrate.

9. A display panel comprising an organic light-emitting diode (OLED) plate, wherein the OLED plate comprises:
a display area and a peripheral area located at a periphery of the display area;
a substrate;
a plurality of OLED devices disposed on one side of the substrate and located in the display area, wherein each of the plurality of OLED devices comprises a reflective anode, an organic material functional layer, and a transparent cathode disposed in a direction distal from the substrate in sequence; and
an auxiliary cathode disposed on the one side of the substrate and a portion of the auxiliary cathode being located in the peripheral area, wherein:
the portion of the auxiliary cathode located in the peripheral area is electrically connected to the transparent cathode of each of the plurality of OLED devices, and a resistivity of the auxiliary cathode is less than a resistivity of the transparent cathode of each of the plurality of OLED devices;
the auxiliary cathode comprises a plurality of parallel first metal lines and a plurality of parallel second metal lines arranged in an intersecting manner, and each of the plurality of parallel first metal lines and each of the plurality of parallel second metal lines both have portions thereof being located in the display area, and portions thereof extending from the display area to the peripheral area;

the display area comprises a plurality of sub-pixel areas distributed in an array, and each of the plurality of sub-pixel areas is provided with one of the OLED devices therein;

the OLED plate further comprises a driving circuit disposed in each of the plurality of sub-pixel areas, and being electrically connected to the reflective anode of the corresponding OLED device in the sub-pixel area;

the auxiliary cathode is disposed between the plurality of OLED devices and the corresponding driving circuit;

the OLED plate further comprises a passivation layer and a first organic layer sequentially disposed on one side of the driving circuit close to the auxiliary cathode, and the auxiliary cathode is disposed on a surface of the first organic layer distal from the passivation layer;

the passivation layer and the first organic layer are disposed between the auxiliary cathode and the driving circuit to increase a distance between the auxiliary cathode and the driving circuit and to reduce a coupling capacitance between the auxiliary cathode and other electrode or wire below the auxiliary cathode;

the display area further comprises a pixel defining layer;

each of the plurality of sub-pixel areas of the OLED plate is defined by the pixel defining layer;

the organic material functional layer of each of the plurality of OLED devices in the OLED plate is formed in an opening area corresponding to the pixel defining layer; and the auxiliary cathode is disposed directly under the organic material functional layer of the corresponding OLED device and within the opening area.

10. A display device comprising a display panel having an organic light-emitting diode (OLED) plate, the OLED plate comprising:

a display area and a peripheral area located at a periphery of the display area;

a substrate;

a plurality of OLED devices disposed on one side of the substrate and located in the display area, wherein each of the plurality of OLED devices comprises a reflective anode, an organic material functional layer, and a transparent cathode disposed in a direction distal from the substrate in sequence; and an auxiliary cathode disposed on the one side of the substrate and a portion of the auxiliary cathode being located in the peripheral area, wherein:

the portion of the auxiliary cathode located in the peripheral area is electrically connected to the transparent cathode of each of the plurality of OLED devices, and a resistivity of the auxiliary cathode is less than a resistivity of the transparent cathode of each of the plurality of OLED devices;

the auxiliary cathode comprises a plurality of parallel first metal lines and a plurality of parallel second metal lines arranged in an intersecting manner, and each of the plurality of parallel first metal lines and each of the plurality of parallel second metal lines both have portions thereof being located in the display area, and portions thereof extending from the display area to the peripheral area;

the display area comprises a plurality of sub-pixel areas distributed in an array, and each of the sub-pixel areas is provided with one of the plurality of OLED devices therein;

the OLED plate further comprises a driving circuit disposed in each of the plurality of sub-pixel areas, and being electrically connected to the reflective anode of the corresponding OLED device in the sub-pixel area;

the auxiliary cathode is disposed between the plurality of OLED devices and the corresponding driving circuit;

the OLED plate further comprises a passivation layer and a first organic layer sequentially disposed on one side of the driving circuit close to the auxiliary cathode, and the auxiliary cathode is disposed on a surface of the first organic layer distal from the passivation layer;

the passivation layer and the first organic layer are disposed between the auxiliary cathode and the driving circuit to increase a distance between the auxiliary cathode and the driving circuit and to reduce a coupling capacitance between the auxiliary cathode and other electrode or wire below the auxiliary cathode;

the display area further comprises a pixel defining layer;

each of the plurality of sub-pixel areas of the OLED plate is defined by the pixel defining layer;

the organic material functional layer of each of the plurality of OLED devices in the OLED plate is formed in an opening area corresponding to the pixel defining layer; and the auxiliary cathode is disposed directly under the organic material functional layer of the corresponding OLED device and within the opening area.

* * * * *